United States Patent [19]

Takahashi

[11] Patent Number: 4,803,393

[45] Date of Patent: Feb. 7, 1989

[54] PIEZOELECTRIC ACTUATOR

[75] Inventor: Takeshi Takahashi, Mishima, Japan

[73] Assignee: Toyota Jidosha Kabushiki Kaisha, Aichi, Japan

[21] Appl. No.: 73,155

[22] Filed: Jul. 14, 1987

[30] Foreign Application Priority Data

Jul. 31, 1986 [JP] Japan ................................. 61-180349
Aug. 19, 1986 [JP] Japan ........................... 61-126359[U]
Apr. 24, 1987 [JP] Japan ................................. 62-102444

[51] Int. Cl.⁴ ............................................ H01L 41/08
[52] U.S. Cl. .................................................... 310/328
  123/478; 239/533.1
[58] Field of Search ............... 310/316, 317, 328, 323;
  123/478, 484, 485, 491, 492, 498; 60/23, 54.5 R;
  91/459; 137/826-828, 830, 831; 239/533,
  583-585

[56] References Cited

U.S. PATENT DOCUMENTS

| | | | |
|---|---|---|---|
| 2,565,158 | 8/1951 | Williams | 310/328 |
| 2,587,482 | 2/1952 | Keller | 310/328 X |
| 3,153,229 | 10/1964 | Roberts | 310/328 X |
| 3,500,799 | 3/1970 | Benson | 123/32 |
| 3,501,099 | 3/1970 | Benson | 310/328 X |
| 3,509,714 | 5/1970 | Walton | 310/328 X |
| 3,598,506 | 8/1971 | O'Neill | 310/328 X |
| 3,635,016 | 1/1972 | Benson | 60/23 |
| 3,738,576 | 6/1973 | O'Neill | 239/533 |
| 3,766,415 | 10/1973 | Dame | 310/328 |
| 4,333,434 | 6/1982 | Brunais et al. | 123/478 |

FOREIGN PATENT DOCUMENTS

| | | |
|---|---|---|
| 484823 | 1/1973 | Japan . |
| 60-19968 | 2/1985 | Japan . |
| 1453978 | 10/1976 | United Kingdom . |
| 1525248 | 9/1978 | United Kingdom . |
| 2087659 | 5/1982 | United Kingdom . |

Primary Examiner—Mark O. Budd
Attorney, Agent, or Firm—Parkhurst, Oliff & Berridge

[57] ABSTRACT

A piezoelectric actuator for moving an object member by utilizing a volume change of a piezoelectric element. The piezoelectric actuator includes a piezoelectric element, an envelope having a bellows or the like at least as a part of the wall, and a pressure chamber in which work oil is hermetically enclosed. Resiliency of the bellows or the like prevents breakdown of the piezoelectric element due to the supply of biased counter force, and highly improved sealing performance of the pressure chamber prevents leakage of the control oil.

15 Claims, 7 Drawing Sheets

PIEZOELECTRIC ACTUATOR

BACKGROUND OF THE INVENTION

1. Field of the Invention

This invention relates to a piezoelectric actuator, especially to a piezoelectric actuator for actuating a movable member such as valves in response to expansion and contraction of a piezoelectric element.

2. Prior Art

Recently, a piezoelectric element featuring high responsiveness in expanding action has been widely used as an actuator in various fields where quick responsiveness is required. For example, the piezoelectric element is used in a fuel injection valve of a fuel injection system so that fuel injection is performed with quick responsiveness to high revolution speed of an internal combustion engine. A fuel injection system utilizing a piezoelectric element has been proposed in Japan Published Unexamined patent application No. Sho 48-4823. A detailed explanation of this art is set forth with reference to FIG. 8.

In a fuel injection system A, a piezoelectric element A1 expands or contracts according to charging or discharging of electricity, thereby a piston A3 is moved up and down within a hydrualic cylinder A2. When the piston A3 is moved down, work oil A4 under the piston A3 is applied with pressure, thus, an upper plunger member A5 is lowered. Then, the upper plunger member A5 comes in contact with a lower plunger member A6 to push it down. As a result, a fuel injection nozzle A7 is opened to inject fuel. A belleville spring A8 is provided under the piston A3 in order to stabilize the piezoelectric element A1 by applying an initial load to the element A1.

The above-mentioned prior art includes some shortcomings set forth. The piezoelectric element A1 is covered with a casing A9. In this case, a certain space must be left between the piezoelectric element A1 and the casing A9 for maintaining sufficient insulation and cooling effects. Since the piezoelectric element A1 and the casing A9 are not in contact with each other, it is difficult to accurately position the element A1 to the casing A9. The element A1, therefore, is sometimes slantingly positioned within the casing A9. If the piezoelectric element A1 is actuated under the above-mentioned condition, a biased counter force is applied to the element A1 by the piston A3, which may result in cracking or sometimes severely damaging the element A1.

Moreover, since the piezoelectric element A1 consists of a number of laminated thin piezoelectric elements, the overall length of the piezoelectric element A1 sometimes varies with a minute error. The end surface of the piezoelectric element, therefore, is sometimes attached to the piston A3 out of perpendicular to the expanding/contracting direction of the piezoelectric element A1. As a result, when the piezoelectric element A1 is actuated, the element A1 is applied with a biased counter force which may lead to a breakdown of the element A1.

Furthermore, if the piezoelectric element A1 is slantingly attached or the element A1 itself includes a certain slant, the piston A3 is also applied with a biased force. Thus, the sliding portion of the piston A3 is apt to have a partial abrasion due to a defective sliding. In a worse case, the piston A3 may be disabled. There is still another problem. Since a space is formed between the piston A3 and the cylinder A2, the work oil A4 collected in a gap under the piston A3 is apt to leak into the piezoelectric element A1. In such a case, the pushing force of the piezoelectric element A1 is not sufficiently transmitted to the plunger A5.

SUMMARY OF THE INVENTION

Accordingly, it is an objective of the present invention to provide a highly improved piezoelectric actuator which can prevent the breakdown of the piezoelectric element due to the slanting attachment and the defective sliding.

The invention has another objective in preventing leakage of the work oil into the piezoelectric element.

These and other objects are achieved by the present invention having a constitution set forth. Namely, a piezoelectric actuator of the present invention includes a piezoelectric element for moving an object member by utilizing a dimensional change of a piezoelectric element, an envelope between the piezoelectric element and the object member, the envelope having a resilient member as at least a part of a wall of the envelope and hermetically containing a fluid, and the resilient member being contracted or expanded responsive to an increase or decrease in the dimension of the piezoelectric element.

Here, the piezoelectric element is defined by any crystal which provides an expansion or contraction in a certain axis when voltage is applied to it. For example, piezoelectric ceramics consisting of laminated PZT (lead zirconate titanate), polymer piezoelectric materials and crystal are available.

The resilient member is, for example, a bellows, a diaphragm or the like which has resiliency as self-restoring force. Alternatively, even if a member itself does not have resiliency, it is possible to enforce the member to restore the original shape by an outer device, e.g., an electromagnetic actuator.

For the fluid to be filled within the envelope, various types of fluid may be used so far as the fluid is hardly compressible under pressure. Liquid is a preferable example.

In the piezoelectric actuator having the above-mentioned constitution, even if the piezoelectric element is slantingly attached, or if the element itself has a slanting lower end surface, the resilient member at the lower end surface of the piezoelectric element contracts and that at the upper end surface expands. Thus, the upper end surface of the envelope comes in contact with the lower end surface of the piezoelectric element with an equable pressure when at least the piezoelectric element expands. Accordingly, biased counter force is never applied to the piezoelectric element, i.e., stress concentration can be prevented.

In a pressure chamber within the envelope in which the liquid enclosed, it is possible to augment the dimensional change of the piezoelectric element, and transmit it to the movable object member. Even if the direction in which the expanding force of the piezoelectric element is applied to the envelope varies, the object member always travels in the direction in which the pressure is applied to the object member. Accordingly, stable movement of the object member is assured.

Since the fluid is hermetically contained in the envelope, the fluid never leaks out into the piezoelectric element, while in the prior art, the work oil can leak out through a sliding portion of the piston A3.

BRIEF DESCRIPTION OF THE DRAWINGS

The invention may be best understood by referring to the following description of preferred embodiments and the drawings in which.

DETAILED DESCRIPTION OF PREFERRED EMBODIMENTS

Figure 1:
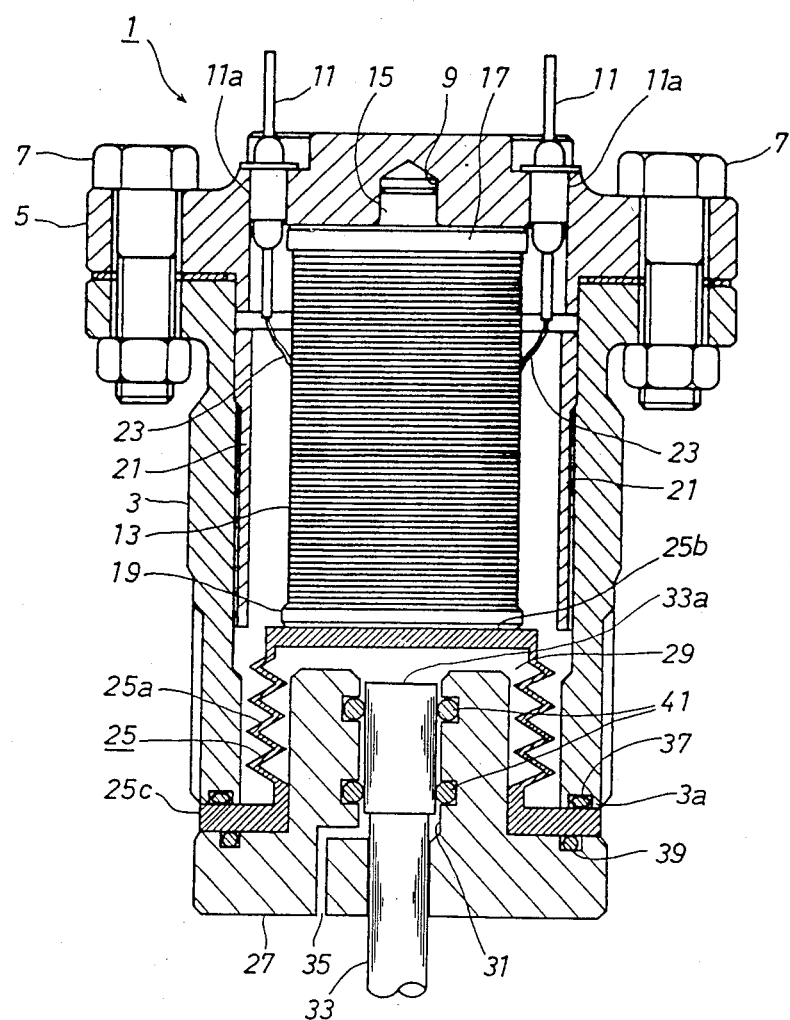
FIG. 1 is a sectional view of a piezoelectric actuator in a first embodiment of the present invention.

Set forth below is the explanation of preferred embodiments of this invention based on the attached drawings. As shown in FIG. 1, an actuator housing 3 and an outer cover 5 forms the externals of a piezoelectric actuator 1. The outer cover 5 is attached to the actuator housing 3 with bolts 7, and a hole 9 is formed at the center of the upper inner surface of the outer cover 5. Moreover, two electrodes 11 are inserted into the outer cover 5 via hermetic sealings 11a. The electrodes are supplied with voltages from a drive circuit (not shown).

The actuator housing 3 includes a piezoelectric element 13 within itself. The piezoelectric element 13 consists of laminated PZT, and expands or contracts in the longitudinal direction. A circular insulator 17 having a cylindrical projection 15 is formed at the upper end of the piezoelectric element 13. At the lower end, another circular insulator member 19 is provided. By inserting the projection 15 into the hole 9 of the outer cover 5, the piezoelectric element 13 is fixedly positioned keeping a certain distance from the inner wall of the actuator housing 3. In order to prevent a short circuit between the piezoelectric element 13 and the inner wall of the actuator housing 3 when the actuator 1 is damaged, the inner wall of the actuator housing 3 is covered with a fluororesin-made insulation film 21. The piezoelectric element 13 is connected to the electrodes 11 via wirings 23 to be applied with voltage.

An envelope 25 is provided across the insulator 19 from the piezoelectric element 13. The envelope 25 has a cylindrical side surface including a bellows 25a. The upper surface 25b of the envelope 25 is attached to the bottom of the insulator 19. The end portion 25c of the envelope 25 is positioned so as to have its outer diameter flush with an end portion 3a of the actuator housing 3. The envelope 25 is integrally formed by welding or forming stainless steel. A plunger barrel 27 supports the end portion 25c of the envelope 25 for making a pressure chamber 29 between the plunger barrel 27 and the envelope 25. The plunger barrel 27 has a convex form intrusive into the pressure chamber 29 for saving effective volume within the pressure chamber 29. Inside the convexity, a guide portion 31 is formed, and a plunger 33 as an object member is fitted into the guide portion 31 which regulates the movement direction of the plunger 33. Work oil is sealed up within the pressure chamber 29. When the pressure chamber is formed, air is exhausted through an air vent hole 35 provided in the plunger barrel 27 so that air bubbles are not mixed into the work oil. Each of the connecting portions between the actuator housing 3 and the envelope 25, between the envelope 25 and the plunger barrel 27, and between the plunger barrel 27 and the plunger 33 is sealed with a ring-shaped rubber sealing members 37, 39 and 41, respectively.

Next, the operation of the above-mentioned piezoelectric actuator is set forth. When voltage is applied to the electrodes 11, the piezoelectric element 13 expands and depresses the upper surface 25b of the envelope 25 via the insulator 19, so that the bellows 25a of the envelope 25 contracts. Then, the depressed work oil pushes the plunger 33 downward. On the other hand, when the piezoelectric element 13 contracts, the bellows 25a of the envelope 25 expands by the restoring force of itself. Thus, the plunger 33 is lifted toward the piezoelectric element 13.

Figure 2:
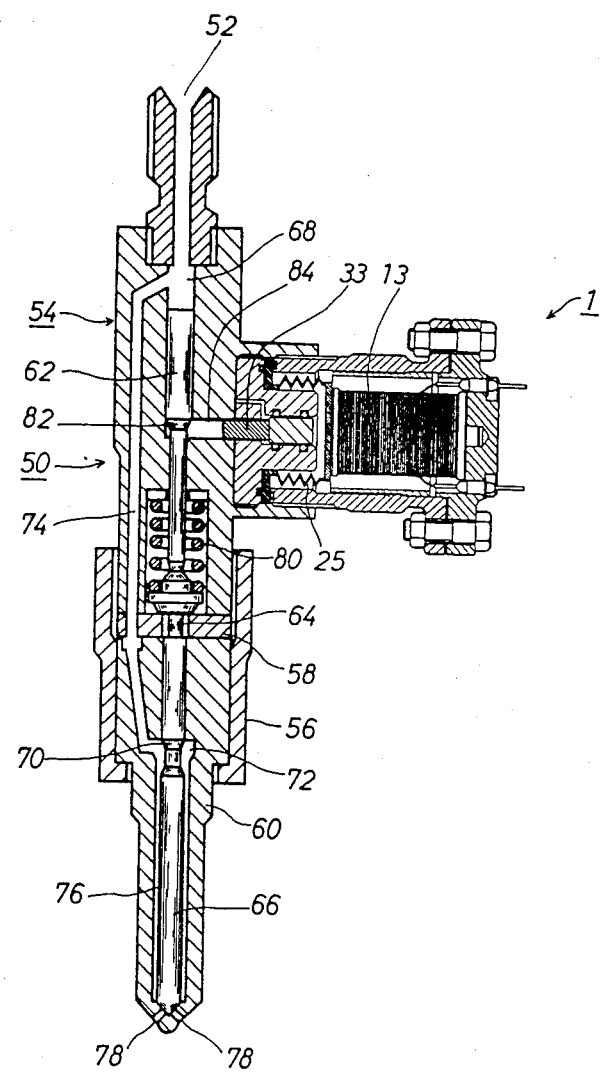
FIG. 2 is a sectional view of a fuel injection valve of a diesel engine which is preferably utilizing the piezoelectric actuator.

A fuel injection valve of a diesel engine which is preferably utilizing the piezoelectric actuator 1 of the first embodiment is hereinunder described based on FIGS. 1 and 2.

As shown in FIG. 2, a fuel injection valve 50 includes the piezoelectric actuator 1, a fuel injection valve member 54 incorporating the piezoelectric actuator 1 and a fuel inlet 52, and a nozzle 60 with a nozzle holder 56 which is connected to the fuel injection valve member 54 via a spacer 58.

A control rod 62, a push-down pin 64 and a needle 66 are connected in series, and each of them is movably inserted into the fuel injection valve member 54, the spacer 58 and the nozzle 60, respectively. Above the control rod 62, a fuel chamber 68 is formed. The fuel pressurized by a pump (not shown) is supplied to the fuel chamber 68 via the fuel inlet 52. Accordingly, the fuel pressure within the fuel chamber 68 acts on the upper surface of the control rod 62. The needle 66 has a conical receiving surface 70. A needle pressure chamber 72 is formed around the receiving surface 70. One end of the needle pressure chamber 72 is connected to the fuel chamber 68 via a fuel path 74, and the other end is connected to nozzle holes 78 at the tip of the nozzle 60 via a fuel path 76 around the needle 66. Moreover, a thrust spring 80 for applying thrust to the push-down pin 64 is provided within the fuel injection valve member 54. The needle 66 is depressed downward by the thrust spring 80. Another conical receiving surface 82 is provided in the middle of the control rod 62. Around the surface 82, a cylindrical control rod pressure chamber 84 is formed. The plunger 33 of the piezoelectric actuator 1 is movably fitted into the chamber 84.

When the work oil within the chamber 84, i.e., fuel to be injected in this case, is not pressurized, the needle 66 is applied with a downward force acting on the upper surface of the control rod 62, another downward force by the thrust spring 80 and an upward force acting on the receiving surface 70 of the needle 66. The diameter of the control rod 62, the spring force of the thrust spring 80 and the area of the receiving surface 70 of the needle 66 are set so that the sum of those downward forces becomes slightly larger than the upward force. Accordingly, the needle 66 is usually applied with a downward force, thereby the nozzle hole 78 is shut off.

When the piezoelectric actuator 1 has a voltage applied to it, the piezoelectric element 13 expands and the plunger 33 moves to the left in the figure. As a result, the pressure within the control rod pressure chamber 84 is increased. At this time, since an upward force is applied to the receiving surface 82 of the control rod 62, the control rod 62 is lifted. Following this, the needle 66 is lifted so that fuel is injected from the nozzle hole 78.

On the other hand, when the voltage apply to the piezoelectric actuator 1 is terminated, the piezoelectric element 13 contracts. As a result, the oil pressure within the control rod pressure chamber 84 is decreased. Thus, the control rod 62 and the needle 66 move down, and fuel injection is terminated.

The feature of the piezoelectric actuator 1 of the first embodiment is summarized as follows. In the piezoelectric actuator 1, the envelope 25 having the bellows 25a as a part of the wall and the pressure chamber 29 with the work oil enclosed is contacting with the piezoelectric element 13 via the insulator 19. The dimensional change of the piezoelectric element is augmented by the pressure chamber 29 to make a greater movement of the plunger 33. Since the counter force is always applied from the envelope 25 to the piezoelectric element 13 in the expanding direction of the element 13, biased counter force is never applied to the element 13 even though the piezoelectric element 13 is slantingly attached or the element 13 itself has a slanting end surface. Accordingly, the damage to the element 13 attributable to the slanting attachment can be prevented. Moreover, the plunger 33 is smoothly slidable on the guide portion 31 since the upper end surface 33a of the plunger 33 is always applied with a force in its moving direction. As a result, stable movement of the plunger 33 is assured. Since the pressure chamber 29 is almost completely sealed up by the envelope 25, the plunger barrel 27 and the sealing members 39 and 41, leakage of the work oil from the pressure chamber 29 and the wasteful driving of the plunger 33 can be prevented when the piezoelectric element 13 is actuated.

In the first embodiment, the piezoelectric element 13 is always applied with a certain load by the restoring force of the bellows 25a. Therefore, the stable operation of the piezoelectric element 13 is realized without any special application of the load by utilizing a belleville spring or the like as in the prior art. As a result, the number of required parts can be reduced. In the prior art, the piston sometimes fails to follow up with the movement of the piezoelectric element because of the rather big mass of the piston. This sometimes results in a collision between the piston and the piezoelectric element, thus damaging the piezoelectric element. In the present embodiment, since the mass of the envelope 25 is smaller, the whole mass of the moving parts can be decreased in comparison with the prior art. As a result, the moving parts are able to follow the rapid vibration of the piezoelectric element 13 without difficulty, and the element 13 is protected against damage.

The fuel injection valve 50 of the diesel engine utilizing the piezoelectric element 1 of the present embodiment can offer superior reliability based on various advantages of the piezoelectric element 1.

Figure 3:
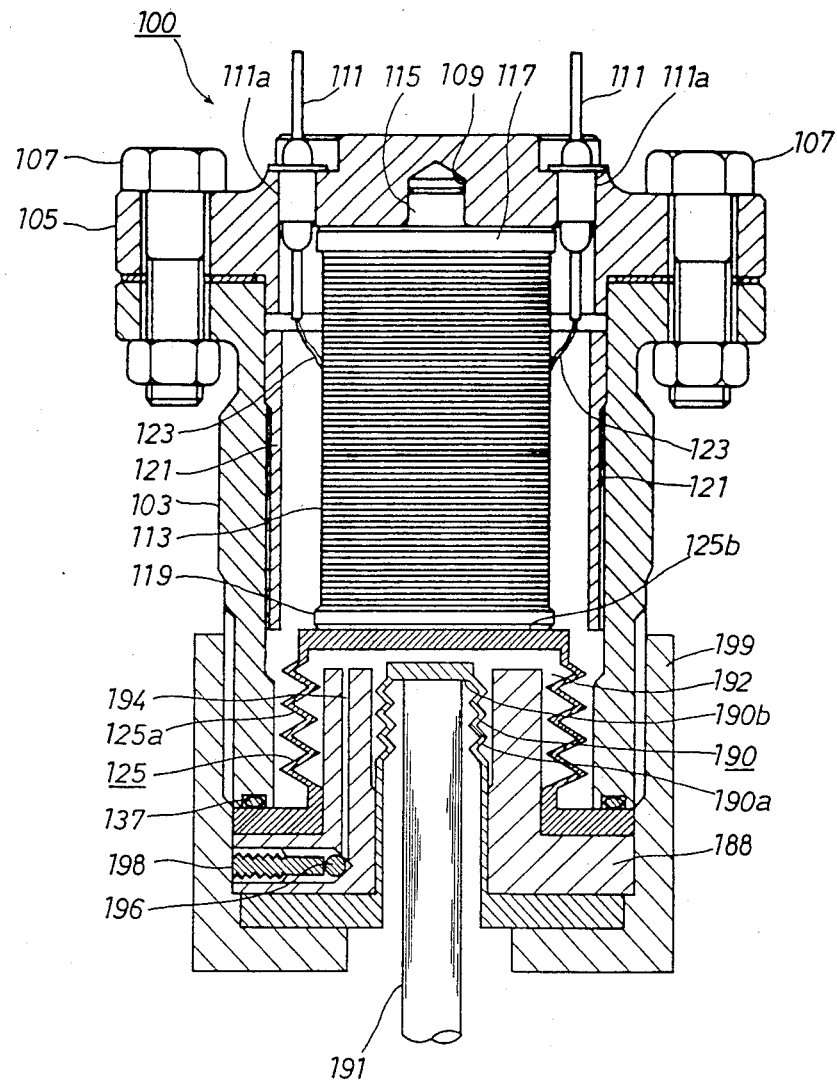
FIG. 3 is a sectional view of a piezoelectric actuator of a second embodiment.

Set forth below is the explanation of a second embodiment with reference to FIG. 3. In FIG. 3, the parts and members which are common to those of the first embodiment shown in FIG. 1 are numbered by utilizing the same last two digits. Explanations for those common parts are referred to in the first embodiment.

The constitution of the second embodiment is almost the same as in the first embodiment, except that a piezoelectric actuator 100 of the second embodiment includes a sleeve 188 and a second envelope 190 instead of the plunger barrel 27 with its built-in components of the first embodiment, so that a rod 191 moves responsive to the movement of the second envelope 190. The second envelope 190 has a cylindrical form whose cylindrical surface is composed of a bellows 190a the same as the bellows 25a in the first embodiment. The rod 191 is connected to the upper inner surface 190b of the second envelope 190. Both the diameter and the spring constant of the second envelope 190 are smaller than those of the first envelope 25. A pressure chamber 192 is formed by the first envelope 125, the sleeve 188 and the second envelope 190. Work oil is hermetically enclosed within the pressure chamber 192.

The sleeve 188 includes an air vent hole 194. A sealing member 196 and a set screw 198 for fixing the sealing member 196 are integrally formed. The above-mentioned air vent hole 194 is used to remove air bubbles contained in the work oil when the work oil is sealed up in the pressure chamber 192. The first envelope 125, the sleeve 188 and the second envelope 190 are fixedly attached to the actuator housing 103 by a holding member 199.

In the above-mentioned piezoelectric actuator 100, the piezoelectric element 113 expands and pushes the upper surface 125b of the first envelope 125 via the insulator 119, and thus the first bellows 125a of the first envelope 125 is contracted. At this time, the second bellows 190b of the second envelope 190 is also contracted, thereby the upper inner surface 190b of the second envelope 190 pushes the rod 191. On the other hand, when the piezoelectric element 113 contracts, both the bellows 125a and 190a are expanded. Then, the restoring force of a spring (not shown) acts on the rod 191 to move it toward the piezoelectric element 113.

The piezoelectric actuator 100 of the second embodiment having the above-mentioned constitutions provides some effects which are common to the first embodiment. In addition, the second embodiment assures superior sealing performance since the inner surface of the pressure chamber 192 is also formed as bellows. Moreover, since the second envelope 190 is installed within the first envelope 125, the effective volume between them can be minimized. As a result, a rather small expansion of the piezoelectric element 113 can make a rather big pressure change within the pressure chamber 192, and accordingly the pushing force applied to the rod 191 is increased. Since the spring constant of the second envelope 190 is set smaller than that of the first envelope 125, the movement of the first envelope 125 can be transmitted to the second envelope 190 without delay. Although each of the first envelope 125, the sleeve 188 and the second envelope 190 is independently formed in this embodiment, it is optionally possible to incorporate them as one body by welding or by other means. By incorporating them, the sealing performance of the pressure chamber 192 is more improved.

Set forth below is the explanation of a third embodiment in reference to FIG. 4. The prominent feature of a piezoelectric actuator 201 of the third embodiment which is different from the first embodiment is that a diaphragm 209 is used instead of the envelope 25 with a bellows. Moreover, the shapes of an actuator housing 203, an outer cover 205 and a plunger barrel 207 are different from those of the first embodiment.

Figure 4:
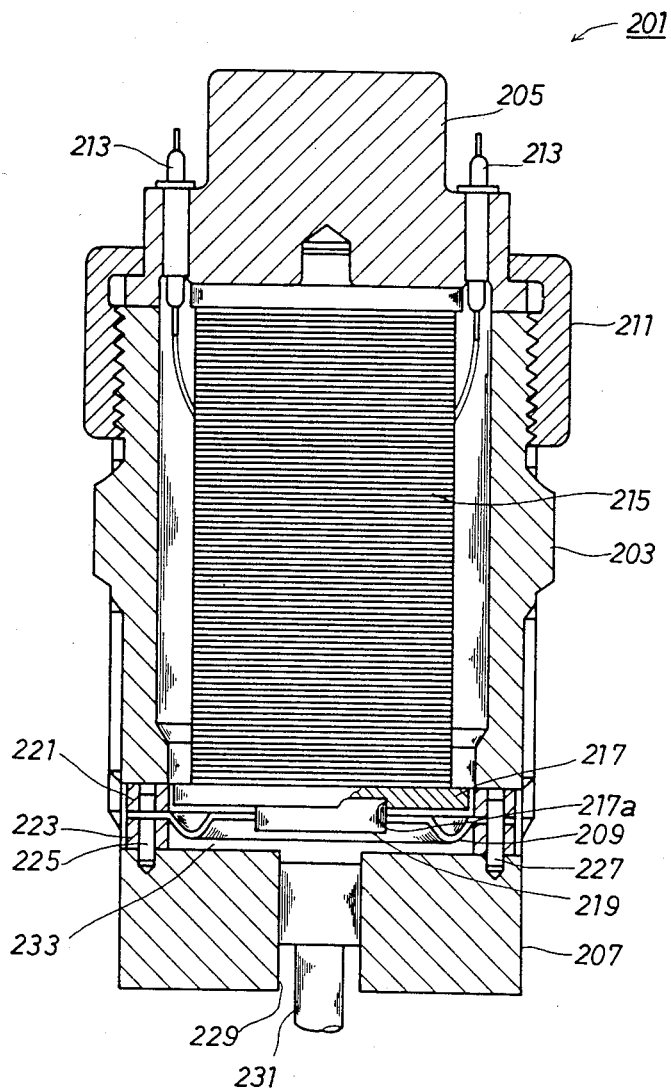
FIG. 4 is a sectional view of a piezoelectric actuator of a third embodiment.
Figure 5:
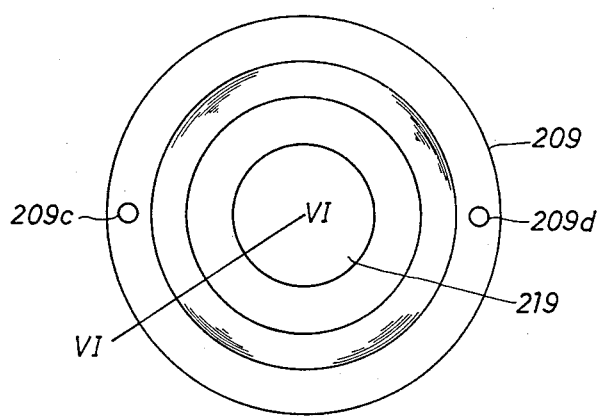
FIG. 5 is a plan view of a diaphragm used in the piezoelectric actuator of the third embodiment.
Figure 6:
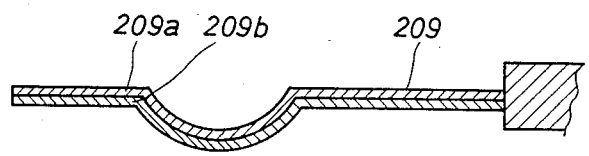
FIG. 6 is a partial sectional view of the diaphragm taken along line VI—VI of FIG. 5.

As shown in FIG. 4, the outer cover 205 is fixedly attached to the actuator housing 203 by sleeve nuts 211. Moreover, two electrodes 213 are inserted into the outer cover 205, and a piezoelectric element 215 is fixed to the outer cover 205 at a certain distance from the internal surface of the actuator housing 203. An insulator 217 is attached to the lower end of the piezoelectric element 215. A circular plate 219 is engaged with a recess 217a formed on the insulator 217. As shown in FIG. 5, a circular diaphragm 209 is formed around the circular plate 219. The diaphragm 209 is made of thin stainless steel plates 209a and 209b having the same surface contour (ref: FIG. 6). Moreover, two pin holes 209c and 209d are provided on a diameter of the diaphragm 209 (ref: FIG. 5). As shown in FIG. 4, the diaphragm 209 is put between a pair of cylindrical retainer rings 221 and 223. Then, the diaphragm is secured to the plunger barrel 207 by means of two through holes formed in the retainer rings 221 and 223 and corresponding pin holes 209c and 209d with screw bolts 225 and 227, respectively. The plunger barrel 207 includes a guide portion 229 for regulating the moving direction of a plunger 231. A space surrounded by the diaphragm 209, the rigid retainer ring 223 and the plunger barrel 207 is a pressure chamber 233 in which work oil is hermetically enclosed.

Next, the operation of the piezoelectric actuator 201 is set forth. When voltage is applied to the electrodes 213, the piezoelectric element 215 expands and depresses the diaphragm 209. At this time, the work oil sealed up in the pressure chamber 233 functions to depress the plunger 231. On the other hand, when the piezoelectric element 215 contracts, the diaphragm 209 is restored to the original state owing to its own restoring force. Thus, the plunger 231 is pulled toward the piezoelectric element 215.

In the piezoelectric actuator 201 of the third embodiment, load applied from the diaphragm 209 to the piezoelectric element 215 always acts in the longitudinal direction of the piezoelectric element 215 in the same manner as the first embodiment. Accordingly, a biased force is never applied to the piezoelectric element 215 and also damage to the element 215 can be prevented. Moreover, stable travel of the plunger 231 is assured and leakage of the work oil from the pressure chamber 233 can be prevented.

Furthermore, since the diaphragm 209 is composed of plural laminated stainless steel plates, the spring constant of the diaphragm can be reduced. Thus, stable movement of the piezoelectric actuator is realized. When a laminated structure is employed for the diaphragm 209, it is possible to have a situation whereby a delamination between the plates may occur when the actuator 201 is driven. In this case, the dimensional change of the piezoelectric element 215 can not be fully transmitted to the pressure chamber 233. This problem can be solved in the third embodiment by making pin holes 209c and 209d in the diaphragm 209 to fasten each of the laminated plates with bolts.

Figure 7:
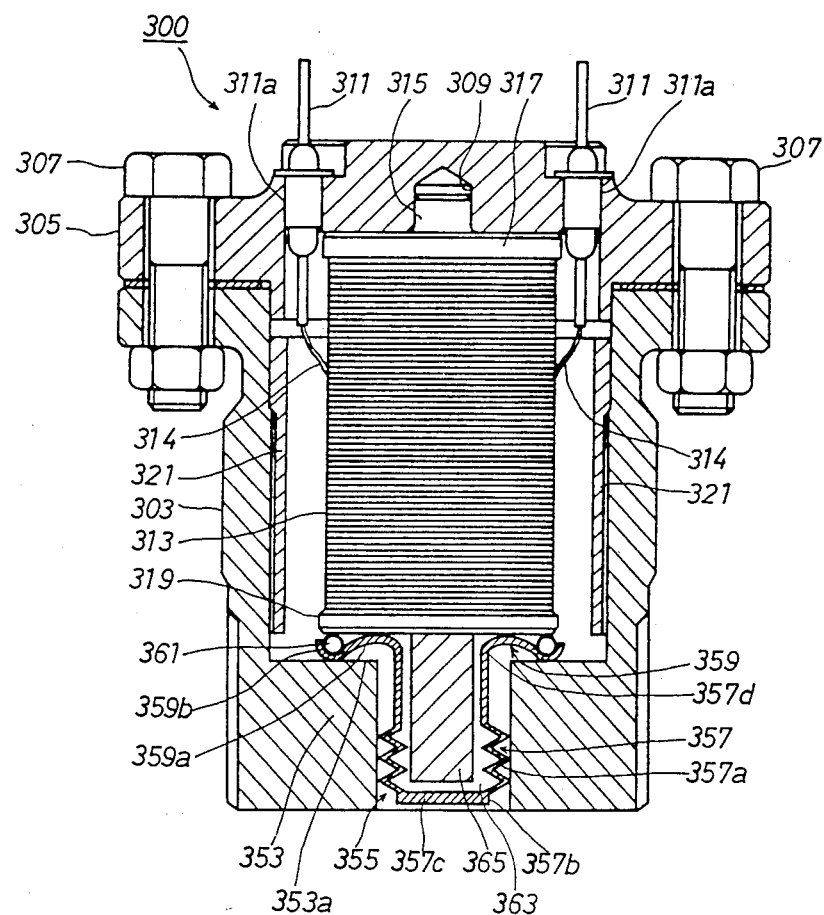
FIG. 7 is a sectional view of a piezoelectric actuator of a fourth embodiment.
Figure 8:
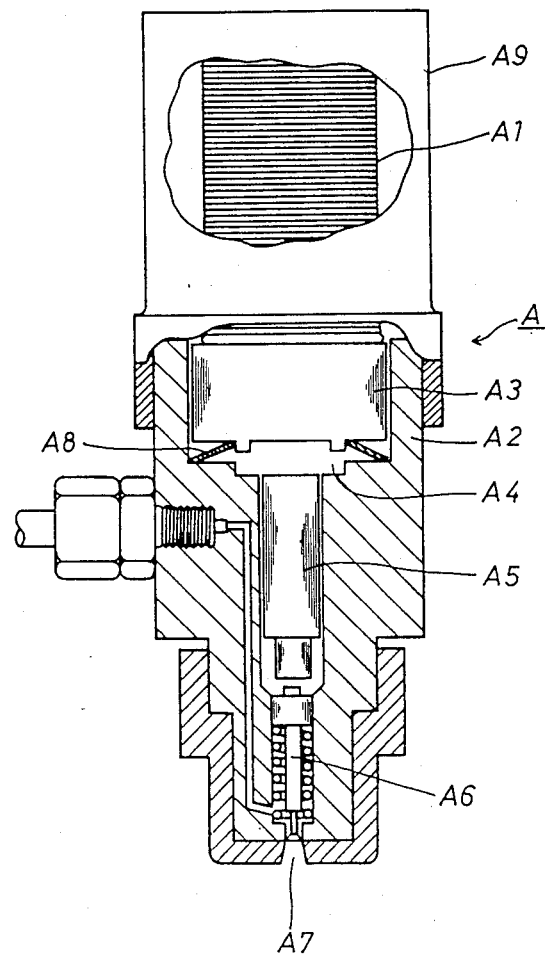
FIG. 8 is a sectional view of a piezoelectric actuator of a prior art.

Next, a fourth embodiment is described. FIG. 7 shows a sectional view of a piezoelectric actuator of the fourth embodiment. In this figure, the parts and members which are common to those of the first embodiment shown in FIG. 1 are numbered by utilizing the same last two digits as in the first embodiment. Explanations for those common parts are also referred to in the first embodiment.

The important features of a piezoelectric actuator 300 of the fourth embodiment can be seen in the shape of the actuator housing 303 and the constitution of a pressure chamber depressed by a piezoelectric element 313.

As shown in FIG. 7, the lower cylindrical part 353 of actuator housing 303 is thicker in comparison with the other embodiments. An envelope 355 is installed within the cylindrical part 353. The envelope 355 is integrally formed from a stainless steel sheet with a cylindrical container part 357 and a wide-opening flange 359. The container part 357 includes bellows 357a as part of its cylindrical surface. One end 357b of the container part 357 is shut off by a bottom plate 357c. The other end 357d is widely opened. The widely-opened flange 359 has a waved form consisting of a protrusion, i.e., an inner fringe 359a, and a depression, i.e., an outer fringe 359b.

The bottom of the outer fringe 359b is suspended on the upper surface 353a of the lower cylindrical body 353 of the actuator housing 303. Thus, the inner fringe 359a is in contact with the insulator 319 so as to push it. The outer fringe 359b is equipped with an O-ring 361 which is in contact with the insulator 319 to provide an improved sealing performance.

Within the envelope 355 sealed by insulator 319 is a pressure chamber 363 in which the work oil (e.g., fuel, if the actuator 300 is used for a fuel injector) is hermetically enclosed. Moreover, a rod 365 is attached to the bottom of the insulator 319 for the purpose of minimizing effective volume of the pressure chamber 363.

The operation of the piezoelectric actuator 300 of this embodiment is set forth. When voltage is applied to the electrodes 311, the piezoelectric element 313 expands and depresses the inner fringe 359a of the flange 359 and the O-ring 361 via the lower insulator 319. As a result, the volume within the space between the flange 359 and the lower insulator 319 is decreased, and the depressed work oil flows from the space into the cylindrical container 357. Consequently, the bellows 357a expands, and the bottom plate 357c moves downward.

On the other hand, when the electrodes 311 are deenergized, the piezoelectric element 313 contracts. As a result, the bellows 357a contracts due to its own restoring force and additional restoring force of another spring (not shown) acting on the bottom plate 357c, and the depressed inner fringe 359a and the O-ring 361 are restored to the original states. In this embodiment, the bottom plate 357c corresponds to the driving portion of the piezoelectric actuator 300 and an object member of the invention. The bottom plate 357c is driven in accordance with expansion and contraction of the piezoelectric element 313.

In the present embodiment, force is applied from the envelope 355 and the O-ring 361 to the piezoelectric element 313 always in the longitudinal direction. As described in the aforementioned embodiments, a biased counter force is never applied to the piezoelectric element 313, therefore, the damage to the element 313 can be prevented. Since the movement of the piezoelectric element 313 is transmitted to the bottom plate 357c via the pressure chamber 363, the bottom plate 357c is applied with force always in the same direction. It is possible to attach a valve member to the bottom plate 357c. In this case, the same effects as mentioned in other embodiments can be obtained. Namely, the valve member can always move in the same direction.

In the fourth embodiment, the flange 359 of the envelope 355 is hermetically sealed by the insulator 319 so as to make a pressure chamber 363, while in the prior art, the pressure chamber is sealed up by a traveling member. Accordingly, the sealed-up work oil never leaks from the pressure chamber 363 due to a gap which may be made by the traveling member. A very high degree of sealing performance of the pressure chamber 363 is an important feature of the fourth embodiment.

Although the envelope 355 and the O-ring 361 are utilized as the resilient members in the present embodiment, it is possible to use only the O-ring for acting the resilient member.

Obviously numerous modifications and variations of the present invention are possible in the light of the above teachings. It is therefore to be understood that within the scope of the claims, the invention may be practiced otherwise than as specifically described herein.

What is claimed is:

1. A piezoelectric actuator for moving an object member by utilizing a dimensional change of a piezoelectric element, comprising an envelope between the piezoelectric element and the object member, said envelope comprising a cylinder having a bellows in a side wall of the cylinder, one end of the cylinder being abutted on the piezoelectric element and the other end of the cylinder being closed by a cap member having a hole, said object member being slidably disposed in said hole, and said envelope hermetically containing a fluid, wherein said cylinder is contracted or expanded responsive to a dimensional increase or decrease in the piezoelectric element.

2. A piezoelectric actuator according to claim 1, wherein said cap member extends into a chamber within said cylinder, such that said member occupies a large part of said chamber.

3. A piezoelectric actuator according to claim 2, wherein said bellows comprises steel plates.

4. A piezoelectric actuator according to claim 3, wherein said actuator is used in a fuel injecting device of an internal combustion engine.

5. A piezoelectric actuator according to claim 1, wherein said envelope comprises a first cylinder and a second cylinder, said object member being disposed within said second cylinder, each cylinder having an open end and a closed end and each cylinder comprising a bellows in a side wall of each cylinder, said second cylinder being disposed within said first cylinder so as to provide a closed chamber containing said fluid between the first and the second cylinders.

6. A piezoelectric actuator according to claim 5, wherein said bellows comprises steel plates.

7. A piezoelectric actuator according to claim 6, wherein said actuator is used in a fuel injecting device of an internal combustion engine.

8. A piezoelectric actuator for moving an object member by utilizing a dimensional change of a piezoelectric element, comprising an envelope between the piezoelectric element and the object member, said envelope being a cylinder having an open end and a closed end, said cylinder comprising a bellows in a side wall of the cylinder, said open end having a flange extending radially outward from said side wall, said flange being concentrically wave shaped and having an outer fringe, said outer fringe contacting the piezoelectric element directly or via an insulator, such that said envelope hermetically contains a fluid, wherein said closed end is used to move said object member responsive to a dimensional increase or decrease in said piezoelectric element.

9. A piezoelectric actuator according to claim 8, wherein a rod member is disposed within said cylinder such that said member occupies a large portion of a volume within said cylinder.

10. A piezoelectric actuator according to claim 9, wherein said cylinder comprises steel plates.

11. A piezoelectric actuator according to claim 10, wherein said actuator is used in a fuel injecting device of an internal combustion engine.

12. A piezoelectric actuator for moving an object member by utilizing a dimensional change of a piezoelectric element, comprising a pressure chamber between the piezoelectric element and the object member, said pressure chamber being cylindrical and bounded by a steel diaphragm member for one end adjacent said piezoelectric element, a rigid ring for a sidewall and a cap member including a plunger barrel for the other end, said steel diaphragm member further comprising a thick circular plate filled into a central recess of an insulator attached to an end of said piezoelectric element and a circular steel diaphragm plate extending radially outward from a peripheral side of said thick circular plate so as to contact said rigid ring, said cap member having a hole, said object member being slidably disposed in said hole, said pressure chamber hermetically containing a fluid, wherein said object member moves within said hole responsive to a dimensional increase or decrease in the piezoelectric element.

13. A piezoelectric actuator according to claim 12, wherein said circular steel diaphragm plate comprises a lamination of a plurality of steel plates.

14. A piezoelectric actuator according to claim 12, wherein said circular steel diaphragm plate is fixed to said rigid ring by clamping the diaphragm between a retainer ring provided oppositely said rigid ring and said rigid ring, and a plurality of pins passing through the rigid ring, the diaphragm and the retainer ring.

15. A piezoelectric actuator according to claim 14, wherein said actuator is used in a fuel injection device of an internal combustion engine.

* * * * *